Figure 1:
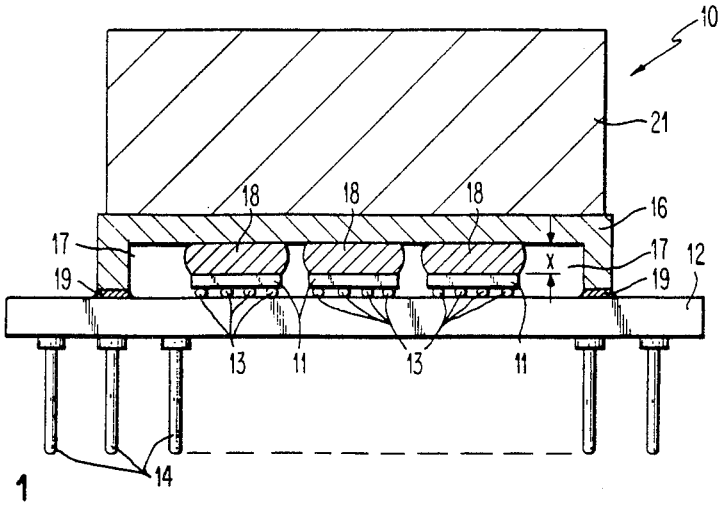
Figure 2:
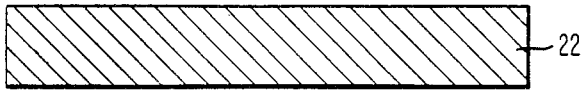
Figure 3:
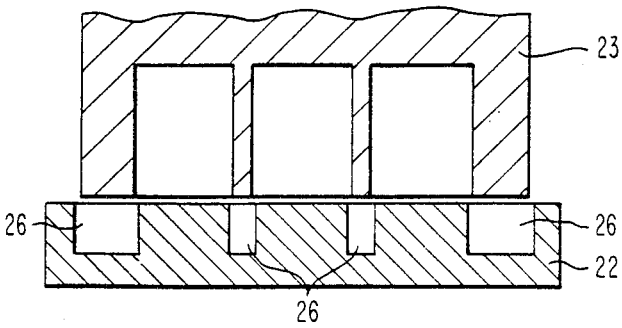
Figure 4:
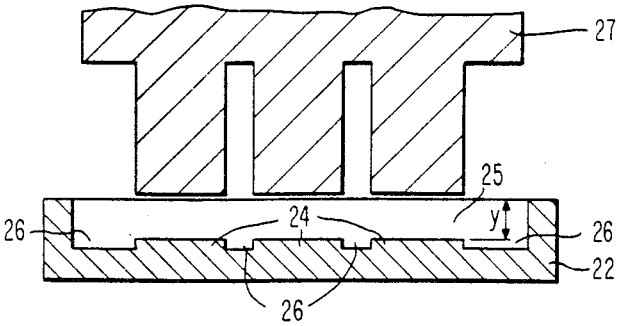
Figure 5:
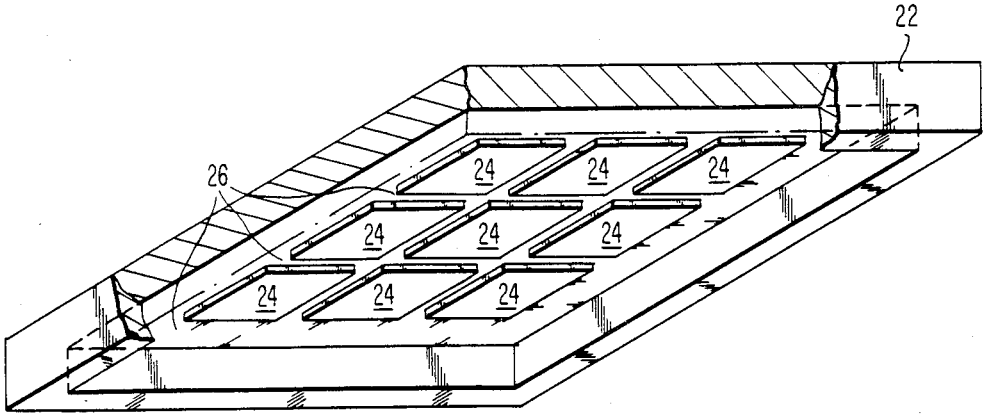
Figure 6:
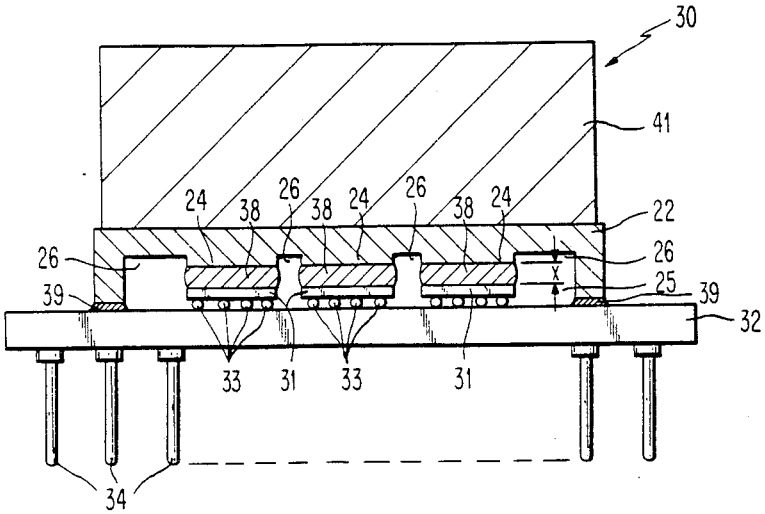

United States Defensive Publication [19] (H) [11] T105,403

Hultmark [43] May 7, 1985

[54] METHOD OF MANUFACTURING A SEALING CAP FOR AN INTEGRATED CIRCUIT CARRYING SUBSTRATE

[76] Inventor: Eric B. Hultmark, 18 Quarry Dr., Wappingers Falls, N.Y. 12590

[21] Appl. No.: 636,877

[22] Filed: Aug. 2, 1984

Related U.S. Application Data

[63] Continuation of Ser. No. 414,764, Sep. 7, 1982, abandoned.

[51] Int. Cl.[3] ..... B29C 17/08

[52] U.S. Cl. ..... 264/23; 264/61; 264/293; 357/74; 428/45

[57] ABSTRACT

A cap for sealing a substrate having integrated circuit chips thereon is manufactured by ultrasonically machining a pattern of channels in the top surface of a plate, the pattern of channels defining a plurality of pedestals at locations corresponding to integrated circuit chip locations on the substrate. The pedestal tops are then ultrasonically machined so that each top lies a predetermined distance from the top surface of the plate.

Ceramic caps manufactured according to the present invention may be mass produced with precise dimensional tolerances.

8 Claims, 2 Sheets Drawing,

13 Pages Specification

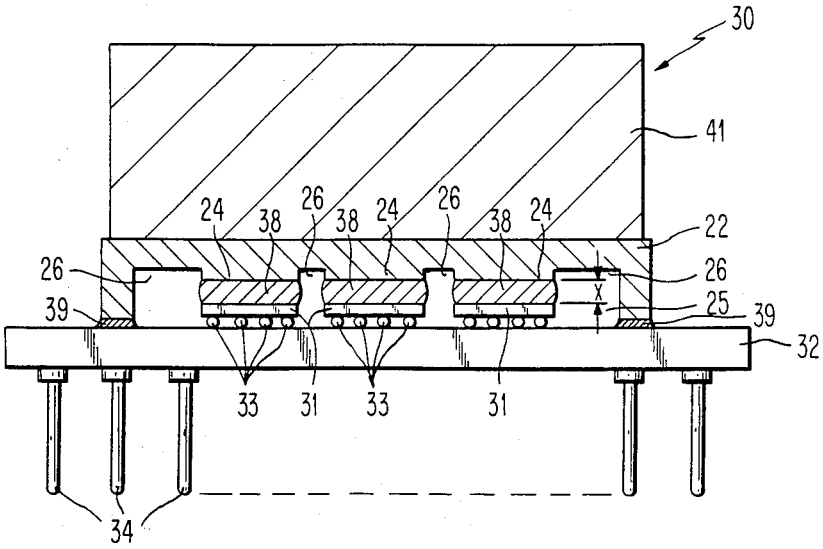

The file of this unexamined application may be inspected and copies thereof may be purchased (849 O.G. 1221, Apr. 9, 1968).